(12) United States Patent
Dubhashi et al.

(10) Patent No.: US 6,650,521 B2
(45) Date of Patent: Nov. 18, 2003

(54) VOLTAGE DIVISION METHOD FOR PROTECTION AGAINST LOAD DUMP CONDITIONS

(75) Inventors: Ajit Dubhashi, Redondo Beach, CA (US); Bertrand Vaysse, Cerritos, CA (US)

(73) Assignee: International Rectifier Corporation, El Segundo, CA (US)

( * ) Notice: Subject to any disclaimer, the term of this patent is extended or adjusted under 35 U.S.C. 154(b) by 64 days.

(21) Appl. No.: 09/927,026

(22) Filed: Aug. 9, 2001

(65) Prior Publication Data

US 2002/0017942 A1 Feb. 14, 2002

Related U.S. Application Data

(60) Provisional application No. 60/223,942, filed on Aug. 9, 2000.

(51) Int. Cl.[7] ................................................. H02H 3/20
(52) U.S. Cl. ..................................... 361/91.1; 361/91.1
(58) Field of Search ......................... 361/56, 58, 91.1, 361/91.5, 111, 118

(56) References Cited

U.S. PATENT DOCUMENTS

| | | | | |
|---|---|---|---|---|
| 4,008,418 A | * | 2/1977 | Murphy | 361/18 |
| 5,019,888 A | * | 5/1991 | Scott et al. | 257/698 |
| 5,235,489 A | * | 8/1993 | Iannuzo | 361/56 |
| 5,276,582 A | * | 1/1994 | Merrill et al. | 361/111 |
| 5,333,105 A | * | 7/1994 | Fortune | 363/56.11 |
| 5,578,960 A | * | 11/1996 | Matsumura et al. | 327/535 |
| 5,764,041 A | * | 6/1998 | Pulvirenti et al. | 323/282 |
| 5,804,977 A | * | 9/1998 | Consiglio | 324/678 |
| 6,137,338 A | * | 10/2000 | Marum et al. | 327/318 |
| 6,331,763 B1 | * | 12/2001 | Thomas et al. | 320/136 |
| 6,509,723 B2 | * | 1/2003 | Matsushita | 323/281 |

* cited by examiner

*Primary Examiner*—Gregory J. Toatley, Jr.
*Assistant Examiner*—Danny Nguyen
(74) *Attorney, Agent, or Firm*—Ostrolenk, Faber, Gerb & Soffen, LLP

(57) ABSTRACT

A protection circuit for a load dump condition employs a voltage division circuit to reduce the voltage applied to the system under test so that the peak applied voltage is reduced to permit the use of a lower voltage rating for power MOSFETs in the system under test. The voltage division circuit employs a resistor and switch in which the switch is closed at voltages higher than a given value at the terminals of the system under test; and is opened when the applied voltage reduces below the given value.

17 Claims, 2 Drawing Sheets

LOAD DUMP TEST CIRCUIT (SIMPLIFIED)

VOLTAGE DIVISION METHOD FOR PROTECTION AGAINST LOAD DUMP CONDITIONS

RELATED APPLICATIONS

This application claims the benefit of U.S. Provisional Application No. 60/223,942, filed Aug. 9, 2000.

FIELD OF THE INVENTION

This invention relates to electronics for automotive application and more specifically relates to a novel protection circuit against load dump test conditions.

BACKGROUND OF THE INVENTION

Automotive electronic systems are required to survive an over voltage condition, commonly known as "load dump" in which inductive components in an automotive circuit produce a voltage spike when the circuit is opened while carrying current. In this test, voltages of over 50 volts can be applied to the automotive electronics. In order to survive this test, power electronics devices, in the circuit under test, such as power MOSFETs and IGBTs, are rated to have breakdown voltages of about 55 volts or, if a zener diode clamp is used, at 38 volts, the devices can be rated at about 40 volts. The on resistance of a MOSFET increases as its reverse voltage rating increases. Thus, devices needed to withstand the load dump condition will have a higher on resistance ($R_{DSON}$) than lower rated voltage devices (rated at the ordinary operating voltage of the system) resulting in a higher power loss.

It would be desirable to configure a protection circuit which would permit lower voltage power electronics devices to adequately pass the load dump test.

SUMMARY OF THE INVENTION

The circuit of the invention is a very small circuit which can reside on a PCB in every automotive electronic module which is required to pass the load dump test. In accordance with the invention, the internal resistance of the test set up is used to divide the voltage seen by the electronics system to voltages as low as 28 volts, thus permitting the use of lower $R_{DSON}$ MOSFETs rated at about 30 volts instead of the higher voltage (40 volts with a zener clamp and 55 volts without the clamp) and higher $R_{DSON}$.

The resulting circuit has a lower cost than prior art solutions which have included use of zener diode to clamp the bus voltage to 38 volts because:

1. Prior art solutions require the use of 40V (when a zener diode clamp is used) or 55V (if no zener diode clamp is used) rated devices which have a significantly higher Rds(on) than 30V rated devices. That means that for the same Rds(on), a 30V device will have a significantly lower cost than a 40V or 55V part, allowing the system to be lower cost.
2. If sized properly, the bill of material cost of the invention (using 30V devices) is lower than that using the zener diode and a 40V device.
3. Zener diodes can not be safely used to clamp the voltage at 30V because the wide variations of the reverse characteristics of the zener diode and its 'soft slope' would cause the zener to dissipate considerable power in double battery condition (24V).

DETAILED DESCRIPTION OF THE DRAWINGS

Figure 1:
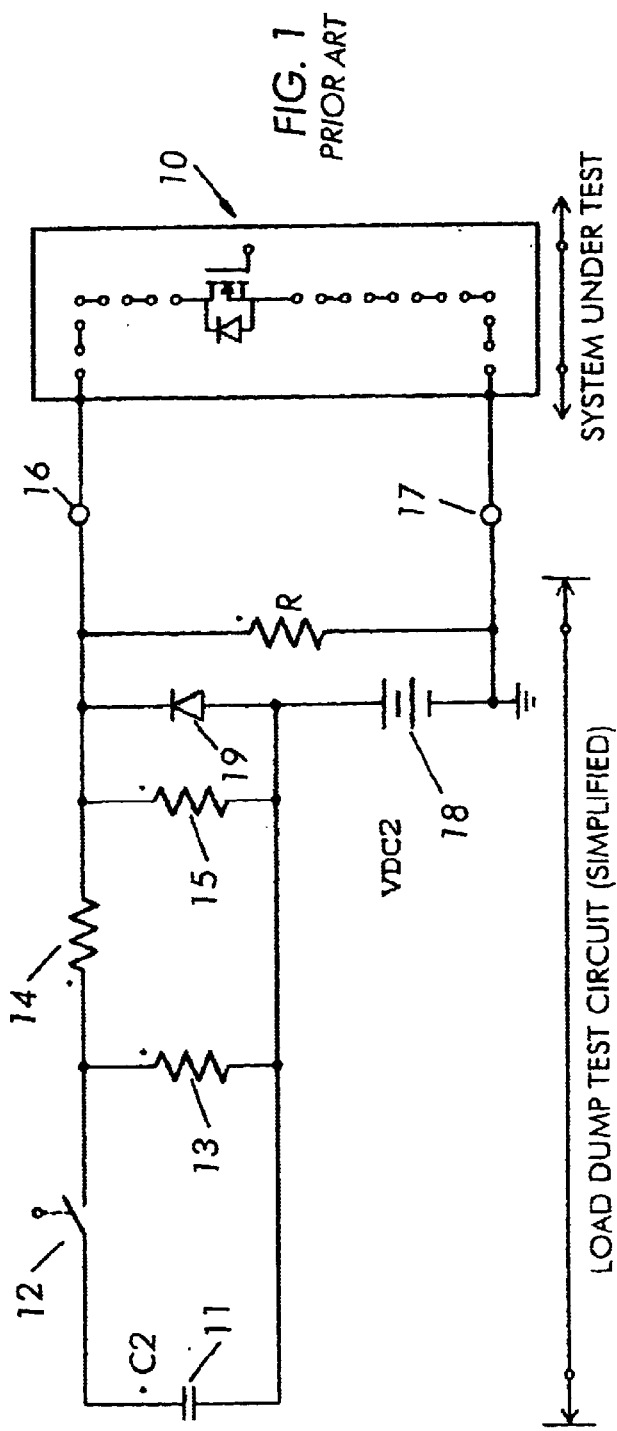
FIG. 1 shows a load dump test circuit.
Figure 2:
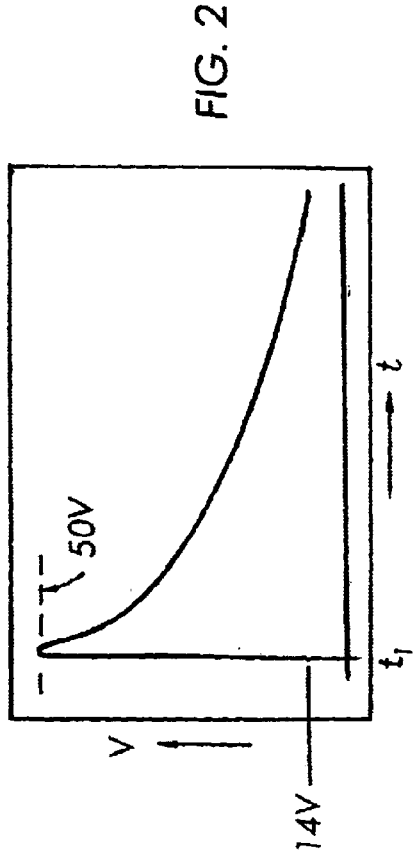
FIG. 2 shows the input voltage to the circuit being tested in FIG. 1 as a function of time.

Referring first to FIG. 1, the test circuit for the system 10 under test is shown. The circuit contains a large capacitor 11 which is charged by a dc source (not shown) to about 100 volts. When test switch 12 connects the test network of resistors 13, 14 and 15 to the system terminals 16 and 17 the capacitor voltage spikes up as shown in FIG. 2. Note that battery 18 and diode 19 are in parallel with resistor R.

The voltage V at terminal 16 is shown in FIG. 2. Thus, at time $t_1$, the switch 12 is closed. The system voltage of about 100 (volts dc is then applied to the system 10 with the voltage V at terminal 16 rising immediately to about 51 volts and then decaying in about 300 milliseconds to the normal battery voltage of 14 volts.

In order to survive this test, the power electronics devices in system 10 must withstand the peak voltage of about 50 volts and are typically chosen to be about 55 volts with their attendant higher $R_{DSON}$.

The circuit of the invention uses the internal resistance of the test setup to divide the voltage seen by the system down to about 30V, in which case 30V devices can be used, which have a lower on resistance value than the 40 volt, zener protected or 55 volt unprotected devices. It is also possible to change the component values and get a higher peak impressed voltage such as 38V (in which case 40V devices could be used).

Figure 3:
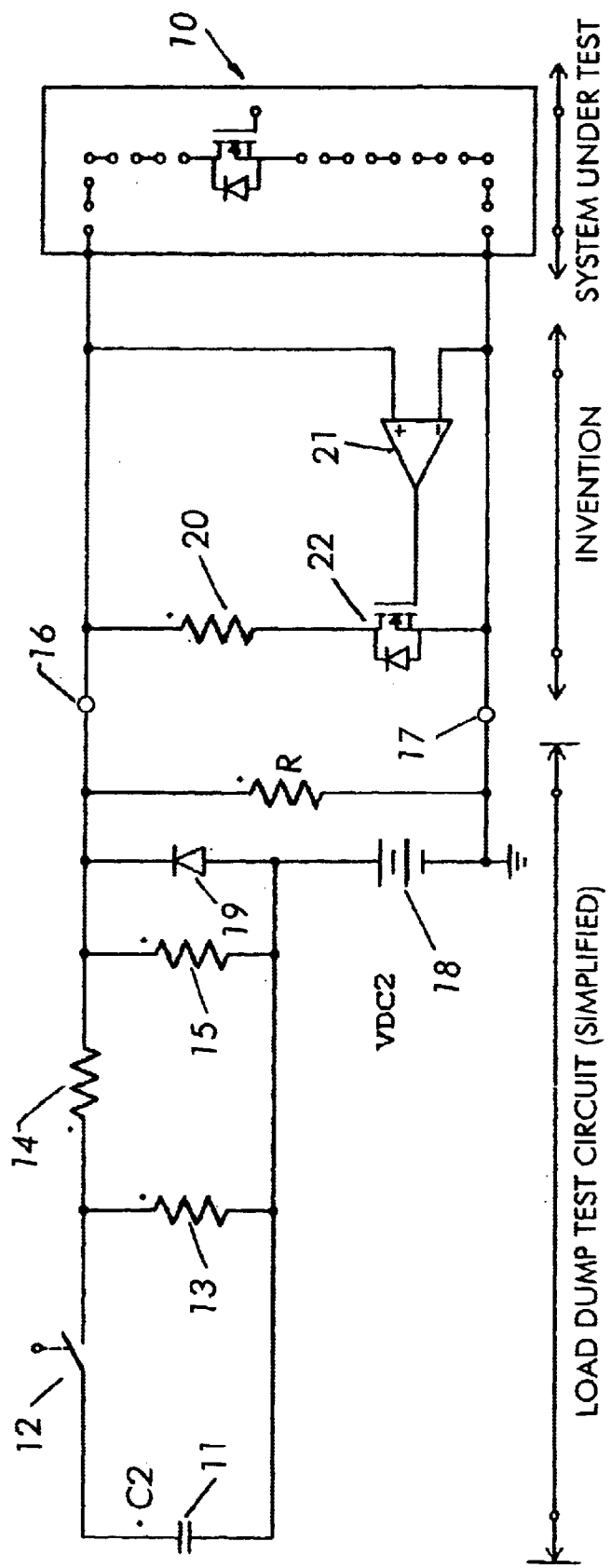
FIG. 3 shows the circuit of the invention.
Figure 4:
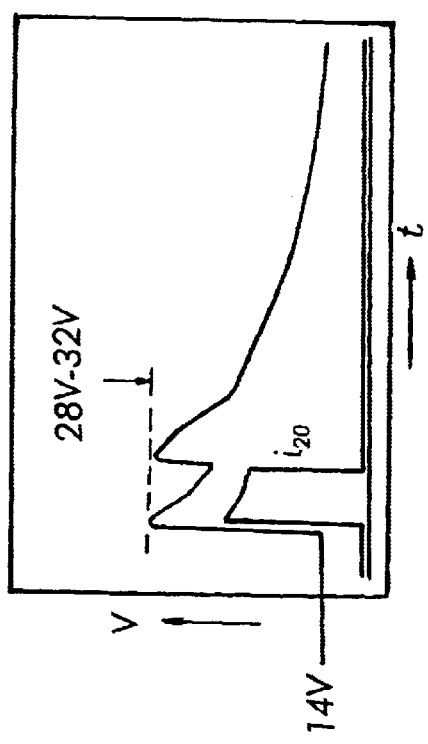
FIG. 4 shows the input voltage produced by the circuit of FIG. 3.

Thus, as shown in FIG. 3 a resistor 20, comparator 21 and a vertical conduction MOSFET 22, or the like are added to the circuit of FIG. 1. Comparator 21 monitors the incoming voltage V and once it is above a predetermined level, turns on the switch 22 (MOSFET, oz Bipolar transistor). This causes a given current to flow through the resistor 20. The resistor 14 thus has an increased current flowing through it which increases the voltage dropped across resistor 14. At a predetermined level of the voltage V, the comparator 21 turns off this current which causes the voltage to rise, but, by this time, the capacitor 11 has discharged sufficiently to allow the voltage to rise to an acceptable level. This operation is shown in FIG. 4.

Therefore, a considerably lower voltage is applied across the system 10 so that the MOSgated device in that system can be derated, for example, to 30 volt devices so that they have a lower power loss in operation.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A protection circuit for protecting an electronic system under a load dump condition; said system containing at least one power MOSFET which has first and second main power terminals; the protection circuit adapted to be coupled to a load dump test circuit, the load dump test circuit having a source of d-c voltage; a capacitor connected to said source of d-c voltage; a first switch; a first resistor; and the protection circuit comprising a controllably conductive device and a second resistor; said capacitor, said first switch, said first resistor and said first and second main power terminals connected in a closed series circuit when the load dump test circuit is connected during a load dump test; said second resistor and said controllably conductive device being connected in closed series relation across said first and second main power terminals; the protection circuit further comprising a control circuit for said controllably conductive device; said control circuit being connected across said first and second main power terminals and being operable to turn on said controllably conductive device when the voltage across said first and second main power terminals exceeds a predetermined value whereby the voltage drop across said first resistor is increased and a voltage across the first and second main power terminals is reduced.

2. The protection circuit of claim 1, wherein said controllably conductive device is a MOSFET and said control circuit includes a comparator.

3. The protection circuit of claim 1, which further includes a third resistor connected in closed series with said capacitor and said first switch.

4. The protection circuit of claim 2, which further includes a third resistor connected in closed series with said capacitor and said first switch.

5. The protection circuit of claim 1, wherein the predetermined value is less than 38 volts.

6. The circuit of claim 2, wherein the predetermined value is less than 38 volts.

7. A load dump test circuit for an automotive system including a power MOSgated device and power terminals; said load dump test circuit comprising a first switch; a capacitor connected to said first switch; an input d-c voltage being connected to said capacitor when said first switch is closed; a first and second resistor connected together in series and having a node; the first switch operable to connect said capacitor to said series connected resistors; said second resistor connected at said node to one of the power terminals of said MOSgated device; a second switch electrically connected on one side to said second resistor and on the other side to another of the power terminals and a control circuit coupled to said power terminals for closing said second switch when the potential across said power terminals exceeds a predetermined value.

8. The load dump test circuit of claim 7, wherein said predetermined value is less than 38 volts.

9. The load dump test circuit of claim 7, wherein said controllably conductive device is a MOSFET and wherein said control circuit includes a comparator circuit.

10. A protection circuit for protecting an automotive system from a load dump provided by a load dump test circuit, the automotive system having at least one power MOSgated device and power terminals, said load dump test circuit comprising an input d-c voltage; a first resistor connected in a predetermined circuit relation with a second resistor of the protection circuit; the load dump test circuit having a pair of output terminals connected to said power terminals during a load dump test; the load dump test circuit having a capacitor connected on one side to said d-c voltage and coupled on the other side to said first resistor during a load dump test by a first switch for changing the circuit relation between said first and second resistors to change the voltage at said power terminals; a second switch connected in series with at least one of said first and second resistors; and a control circuit coupled across said power terminals for operating said second switch to change the output voltage at said power terminals when the potential across said power terminals exceeds a predetermined value.

11. The load dump test circuit of claim 10, wherein said predetermined value is less than 38 volts.

12. The circuit of claim 10, wherein said second switch uses a MOSFET and wherein said control circuit includes a comparator circuit.

13. The protection circuit of claim 5, wherein said control circuit is further operable to turn off said controllably conductive device if the voltage across said main power terminals is less than another predetermined value.

14. The protection circuit of claim 13, wherein said another predetermined value is greater than 14 volts.

15. The load dump test circuit of claim 8, wherein the control circuit opens said second switch when the potential across said power terminals becomes less than another predetermined voltage.

16. The load dump test circuit of claim 15, wherein said another predetermined voltage is greater than 14 volts.

17. The load dump test circuit of claim 15, wherein said second switch is a MOSFET.

* * * * *